(12) United States Patent
Guo et al.

(10) Patent No.: US 11,972,813 B2
(45) Date of Patent: Apr. 30, 2024

(54) SYSTEMS AND METHODS FOR ADAPTING SENSE TIME

(71) Applicant: SanDisk Technologies LLC, Addison, TX (US)

(72) Inventors: Jiacen Guo, Cupertino, CA (US); Xiang Yang, Santa Clara, CA (US); Swaroop Kaza, San Jose, CA (US); Laidong Wang, Sunnyvale, CA (US)

(73) Assignee: SanDisk Technologies, LLC, Addison, TX (US)

( * ) Notice: Subject to any disclaimer, the term of this patent is extended or adjusted under 35 U.S.C. 154(b) by 162 days.

(21) Appl. No.: 17/556,477

(22) Filed: Dec. 20, 2021

(65) Prior Publication Data
US 2023/0197174 A1   Jun. 22, 2023

(51) Int. Cl.
*G11C 16/26* (2006.01)
*G11C 16/10* (2006.01)
*G11C 16/32* (2006.01)
*G11C 16/34* (2006.01)

(52) U.S. Cl.
CPC ........ *G11C 16/3459* (2013.01); *G11C 16/102* (2013.01); *G11C 16/26* (2013.01); *G11C 16/32* (2013.01); *G11C 16/3409* (2013.01)

(58) Field of Classification Search
CPC ... G11C 16/3459; G11C 16/102; G11C 16/26; G11C 16/32; G11C 16/3409; G11C 16/10; G11C 16/0483
See application file for complete search history.

(56) References Cited

U.S. PATENT DOCUMENTS

2021/0191651 A1* 6/2021 Sharon ................ G06F 11/1068

* cited by examiner

*Primary Examiner* — Xiaochun L Chen
(74) *Attorney, Agent, or Firm* — Dickinson Wright PLLC; Steven C. Hurles

(57) ABSTRACT

A memory device with adaptive sense time tables is disclosed. In order to maintain a desired (initial or preset) threshold voltage distribution, the sense time is adjusted as the program-erase cycle count increases. The program-erase cycle process tends to wear down memory cells, causing the QPW window to expand and the threshold voltage to widen. However, by adjusting (i.e., reducing) the sense time for increased program-erase cycles, the QPW window and the threshold voltage can be at least substantially maintained. Additionally, systems and methods for adjusting sense time based on die-to-die variations are also disclosed.

17 Claims, 17 Drawing Sheets

| 1202a | 1202b | 1202c | 1202d | 1202e |
|---|---|---|---|---|
| Cycling No. | DSEN A | DSEN B | DSEN C | DSEN D |
| 1 | $\tau\_A$ | $\tau\_B$ | $\tau\_C$ | $\tau\_D$ |
| 4K | $\tau\_A + \Delta$ | $\tau\_B + \Delta$ | $\tau\_C + \Delta$ | $\tau\_D + \Delta$ |
| 8K | $\tau\_A + 2\Delta$ | $\tau\_B + 2\Delta$ | $\tau\_C + 2\Delta$ | $\tau\_D + 2\Delta$ |

SYSTEMS AND METHODS FOR ADAPTING SENSE TIME

TECHNICAL FIELD

This application is directed to developing an adaptive sense time based on increasing program-erase cycles. In particular, this application is directed to dynamically adjusting a sense time to determine a verify voltage (e.g., verify low voltage) for memory blocks with varying cycling times, which can be used to maintain a desired threshold voltage.

BACKGROUND

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery. Such non-volatile memory devices may include a plurality of memory cells that are arranged in an array which includes a plurality of word lines.

During a program verify operation, the threshold voltage ("Vt") of a memory cell can be determined by controlling the time it takes for the sense node to discharge through a bit line coupled to the memory cell. Therefore, the Vt is the function of the discharging time, the longer of the discharging time, the smaller of the determined Vt. Some current schemes use two different sense times to determine the memory cell behavior. For example, a verify high ("VH") voltage may define the desired, final Vt of the memory cell once programming has been completed, while a verify low ("VL") voltage may correspond with a Vt where programming is slowed in a process known as quick pass write ("QPW") to allow for more accurate programming. The voltage gap between VH and VL is sometimes known as the QPW window or zone.

While the initial QPW window tends to work efficiently for fresh (i.e., non-used or slightly used) cells, the QPW window may shift after many program cycles. In this regard, the VL voltage tends to shift lower, thereby widening the QPW window. As a result, issues such as over-programming may occur.

SUMMARY

According to an aspect of the present disclosure is related to a method for accessing a block of a memory device. The method includes obtaining a first sense time that corresponds to a first verify voltage of a programming state. The method further includes obtaining a cycling count of the memory cell. The method further includes generating, based on the cycling count, a second sense time that corresponds to a second verify voltage of the programming state.

In an embodiment, a voltage gap between the first and second verify voltages defines a QPW window.

In an embodiment, the first verify voltage is greater than the second verify voltage.

In an embodiment, the first sense time is longer than the second sense time.

In an embodiment, when the cycling count increases from a first cycling count to a second cycling count, the second sense time increases from a first time to a second time.

In an embodiment, generating the second sense time include obtaining a predetermined number, and adding the predetermined number from a prior sense time.

In an embodiment, the method further includes further comprising generating, based on a second cycling count greater than the cycling count, a third sense time of the memory cell, wherein the third sense time is longer than the second sense time.

According to another aspect of the disclosure, a memory system includes a memory device. The memory system further includes a controller operatively coupled to the memory device. The controller is configured to obtain a first sense time that corresponds to a first verify voltage of a programmed data state. The controller is further configured to obtain a cycling count of the memory cell. The controller is further configured to generate, based on the cycling count, a second sense time of the memory cell, the second sense time corresponding to a second verify voltage of the programming state.

In an embodiment, In an embodiment, a voltage gap between the first and second verify voltages defines a QPW window.

In an embodiment, the first verify voltage is greater than the second verify voltage.

In an embodiment, the first sense time is longer than the second sense time.

In an embodiment, when the cycling count increases from a first cycling count to a second cycling count, the second sense time increases from a first time to a second time.

In an embodiment, generating the second sense time include obtaining a predetermined number, and adding the predetermined number from a prior sense time.

In an embodiment, the method further includes further comprising generating, based on a second cycling count greater than the cycling count, a third sense time of the memory cell, wherein the third sense time is longer than the second sense time.

According to another aspect of the disclosure, a non-transitory computer readable storage medium configured to store instructions that, when executed by a processor included a controller of a memory system, cause the memory system to carry out steps to obtain a first sense time that corresponds to a first verify voltage of a programmed data state. The controller is further configured to obtain a cycling count of the memory cell. The controller is further configured to generate, based on the cycling count, a second sense time of the memory cell, the second sense time corresponding to a second verify voltage of the programming state.

In an embodiment, a voltage gap between the first and second verify voltages defines a QPW window.

In an embodiment, the first verify voltage is greater than the second verify voltage.

In an embodiment, the first sense time is longer than the second sense time.

In an embodiment, when the cycling count increases from a first cycling count to a second cycling count, the second sense time increases from a first time to a second time.

In an embodiment, generating the second sense time include obtaining a predetermined number, and adding the predetermined number from a prior sense time.

In an embodiment, the method further includes further comprising generating, based on a second cycling count greater than the cycling count, a third sense time of the memory cell, wherein the third sense time is longer than the second sense time.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1A:
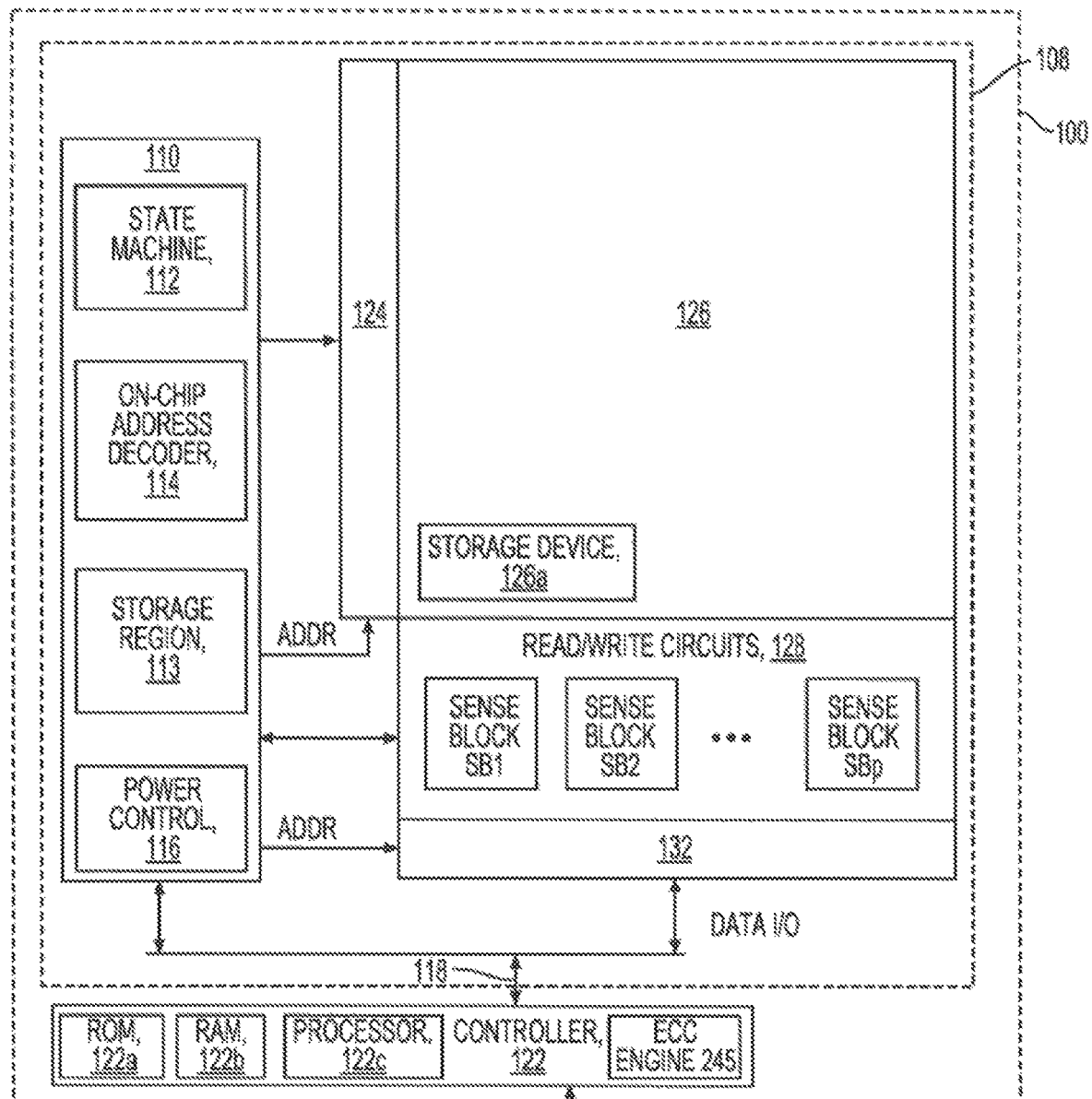
FIG. 1A is a block diagram of an example memory device.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is related to using an adaptive sense time to adjust the sense time for certain operations (e.g., verify operations) to maintain a desired QPW window during the operating life of a memory device. As described herein, the sense time may refer to a time interval/duration required to finish the sensing process. There are two sense times selected to form a QPW window, VH and VL. The VH voltage represents the Vt of a programmed data state, while the VL combines with VH to define the QPW window in which programming is slowed.

A subthreshold swing ("SS"), or subthreshold slope, represents the change in current based on the change in voltage (for example from VL to VH). Generally, the SS is steep such that a small voltage change results in a relatively large current change. Initially at the beginning of life ("BOL") of a memory cell (i.e., when little to no program-erase cycling occurs), the QPW window is optimized. However, as the cycling number of the memory cell increases, the memory cell begins to wear. For example, erase/program cycling involves the electrons tunneling, which generates defects and traps between the charge trapping layer ("CTL") and the channel ("CNL"). In this regard, at the end of life ("EOL") of a memory cell (i.e., 8,000 or more cycles), the SS degrades and issues (e.g., over-programming) may occur.

In order to stabilize the Vt distribution, an adaptive sense time table can be used to modulate VL over the operating life of the memory device. The adaptive sense time table may include a predetermined, incremental number, $\Delta$, that is subtracted from the current sensing time. As VL begins to decrease (based upon the increased cycling number), the reduction of the sense time by $\Delta$ (or some multiple of $\Delta$) can modify (i.e., reduce) VL to maintain (or at least substantially maintain) the original, desired QPW window. As a result, Vt distribution after programming are also maintained during the whole life of the memory device.

Additionally, due to fabrication imperfections, the metal (W)-aluminum oxide ($Al2O3$)-nitride ($Si3N4$)-oxide ($SiO2$)-silicon (Si) ("MANOS") structures have intrinsic variations from die to die. While the QPW window is the same for all blocks at BOL, after several program-erase cycles, the degree of damage of the MANOS can be different from die to die. Accordingly, the SS will also be different from die to die, and different dies will have different optimal QPW windows. However, the adaptive sense table described above can further be used to overcome these variations by offering a die-level, dynamic QPW window based on the program-erase cycles. For example, after several cycles, a background scan is performed to obtain an optimal dynamic sense time ("DSEN") table for each die. These updated DSEN tables are used to perform verify operations up to a higher cycling number. Then, a similar operation can be performed at the higher cycling number to obtain a new optimal DSEN table for each die.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
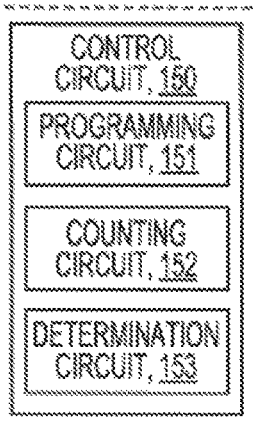
FIG. 1B is a block diagram of an example control circuit that includes a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
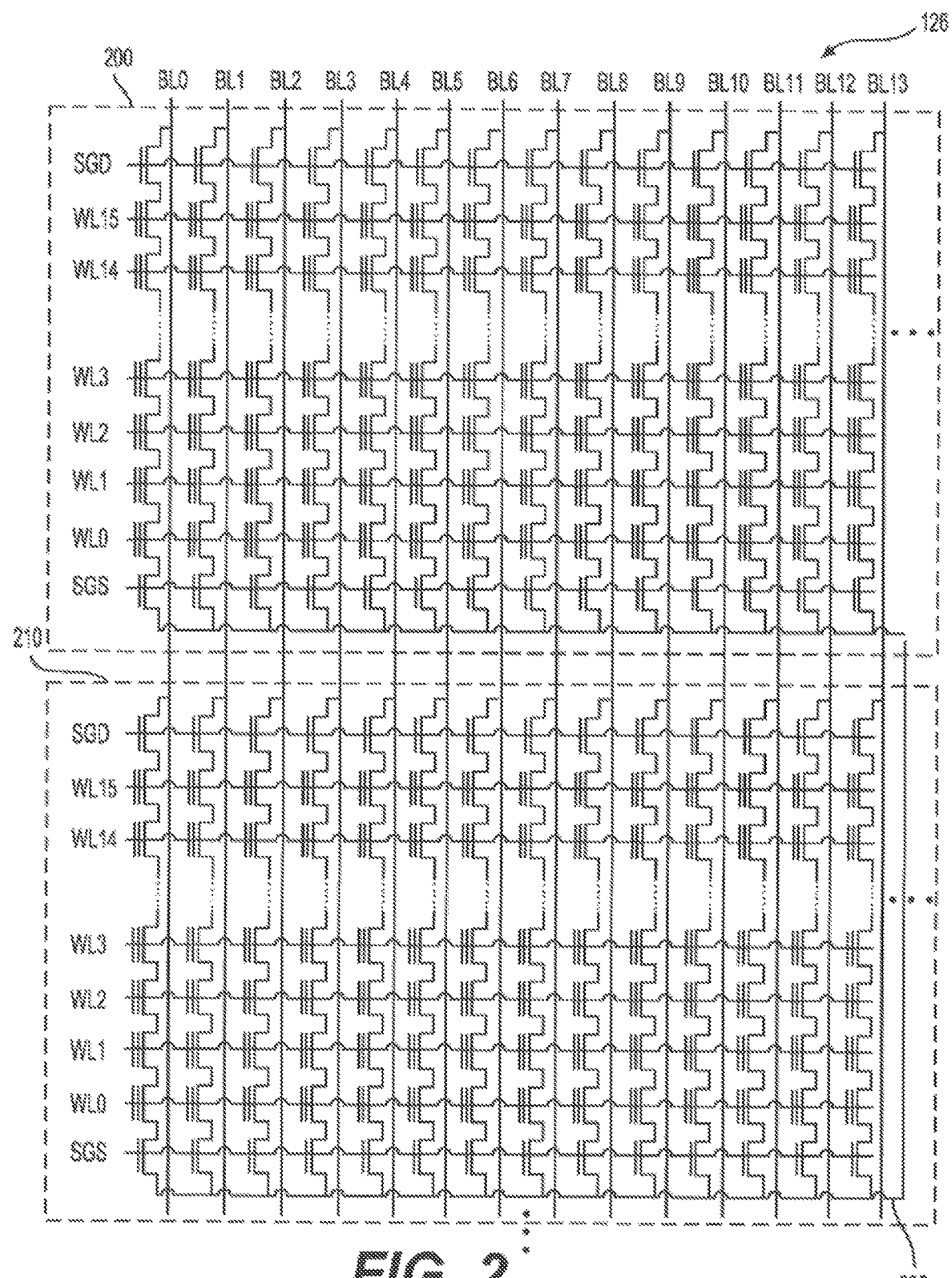
FIG. 2 illustrates schematic views of three types of memory architectures utilizing staggered memory strings.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
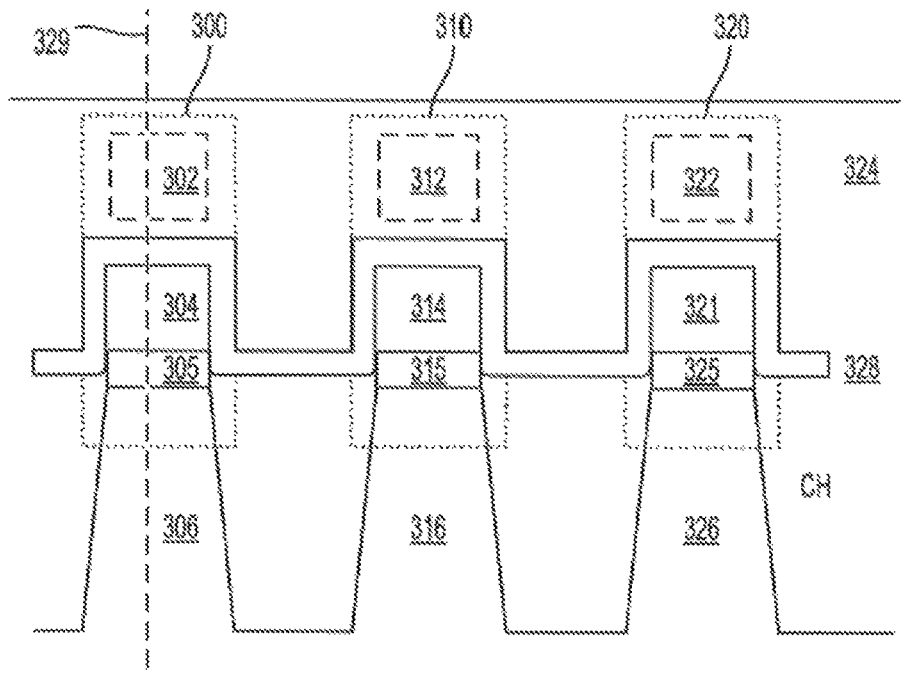
FIG. 3A illustrates a cross-sectional view of example floating gate memory cells in NAND strings.
Figure 3B:
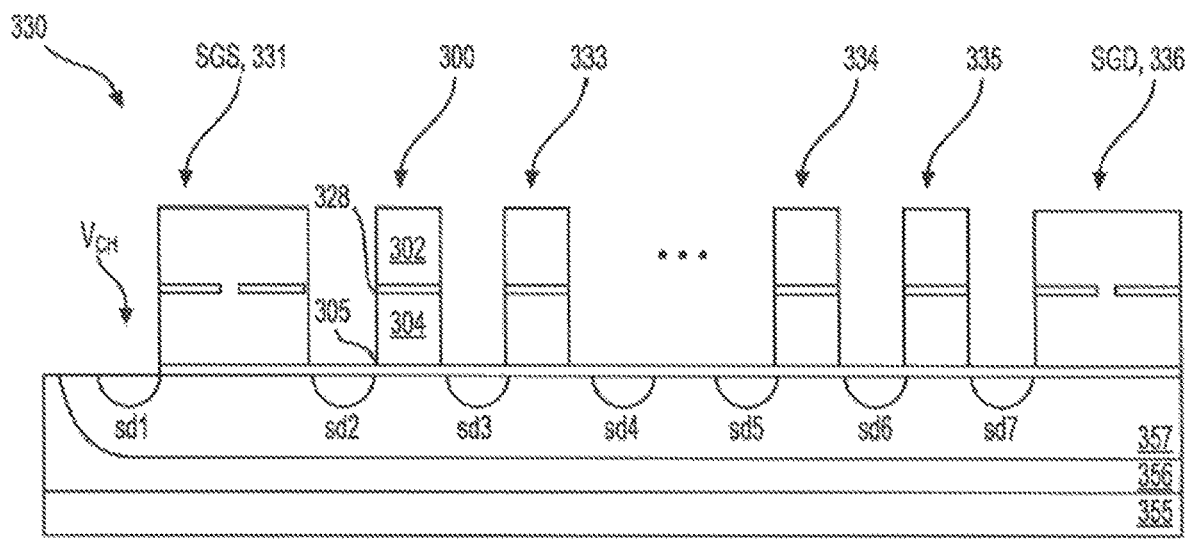
FIG. 3B illustrates a cross-sectional view along a contact line shown in FIG. 3A.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
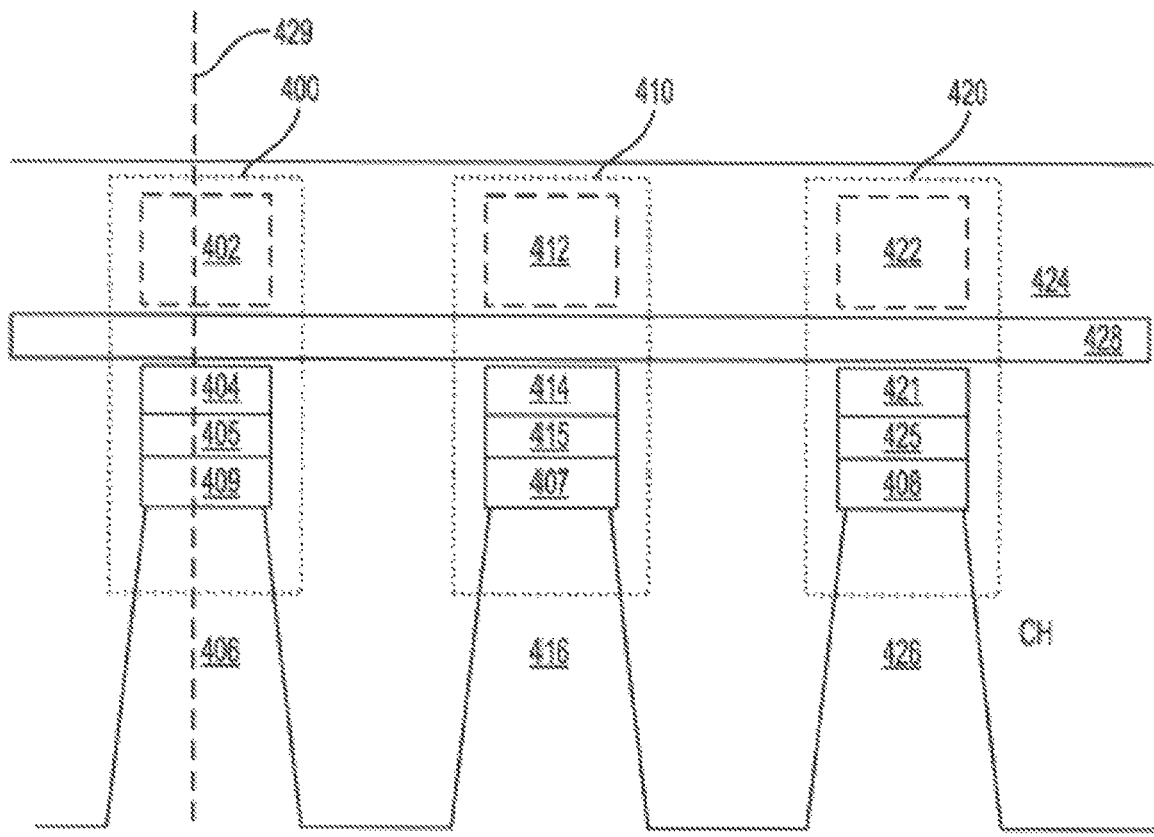
FIGS. 4A and 4B illustrate non-volatile memory in which a charge-trapping memory cell uses a non-conductive dielectric material in place of a conductive floating gate to store charge in a non-volatile manner.
Figure 4B:
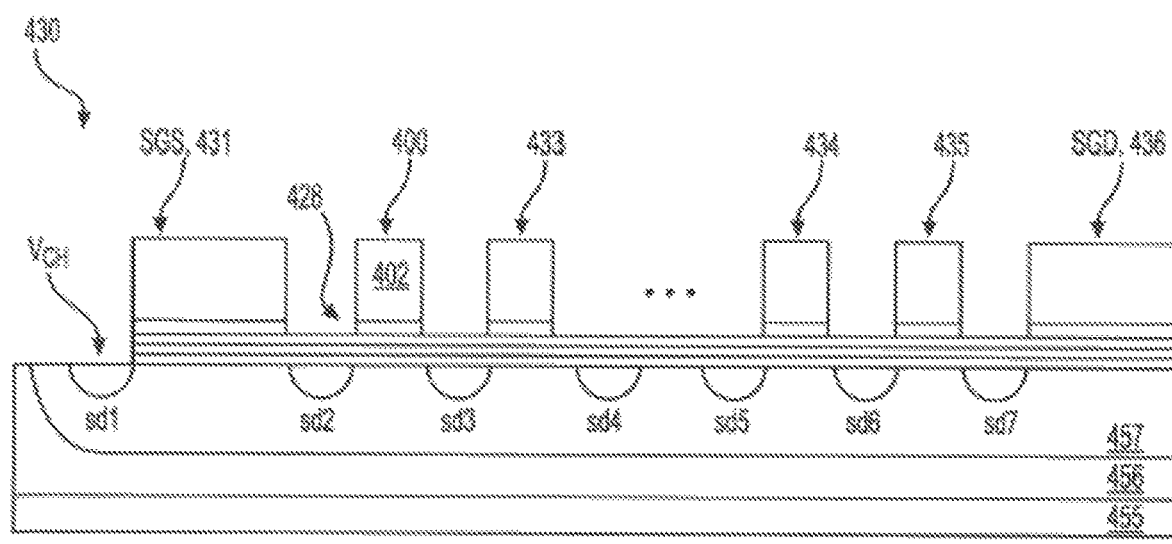

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (0) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
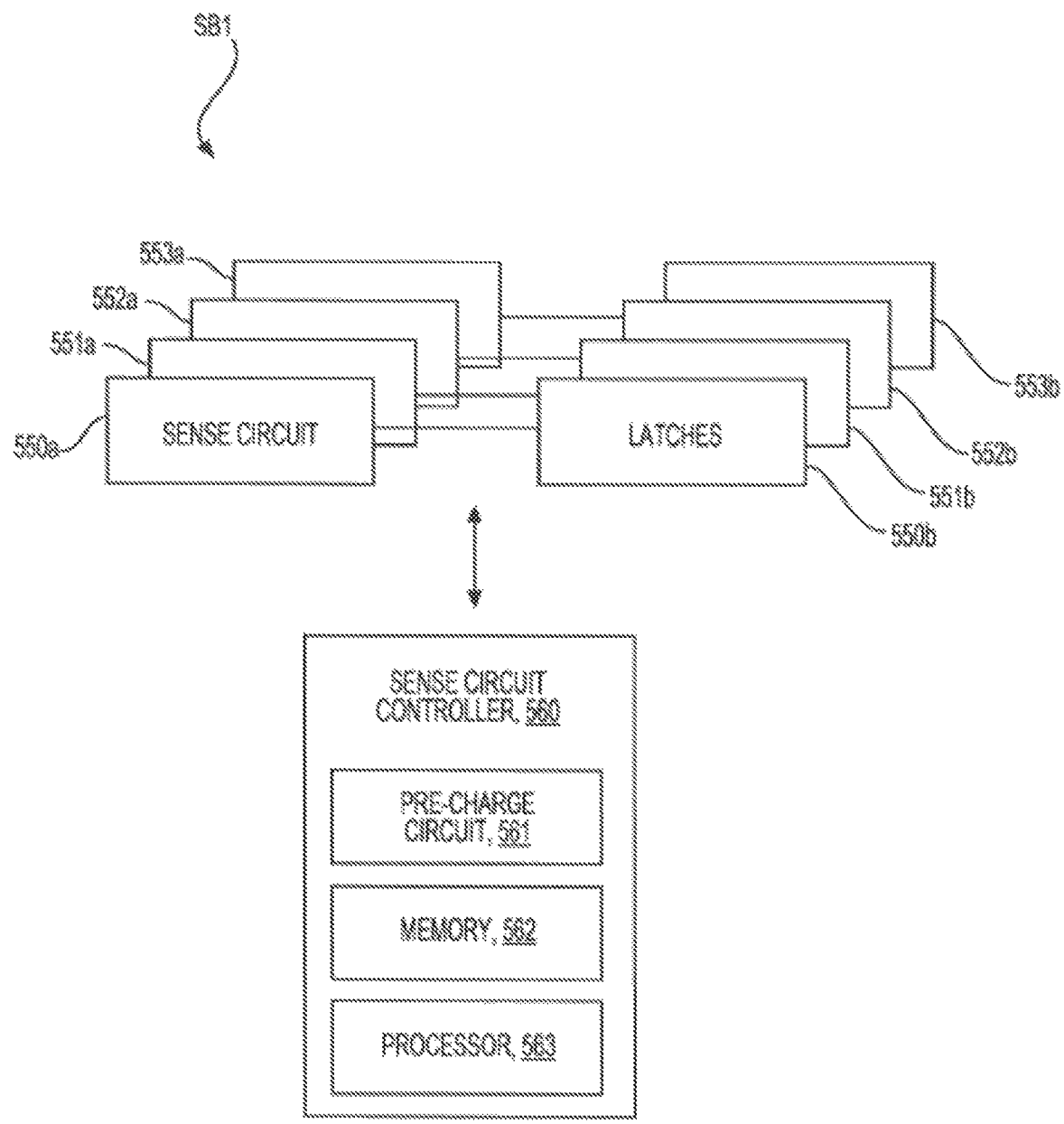
FIG. 5 illustrates an example block diagram of the sense block of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
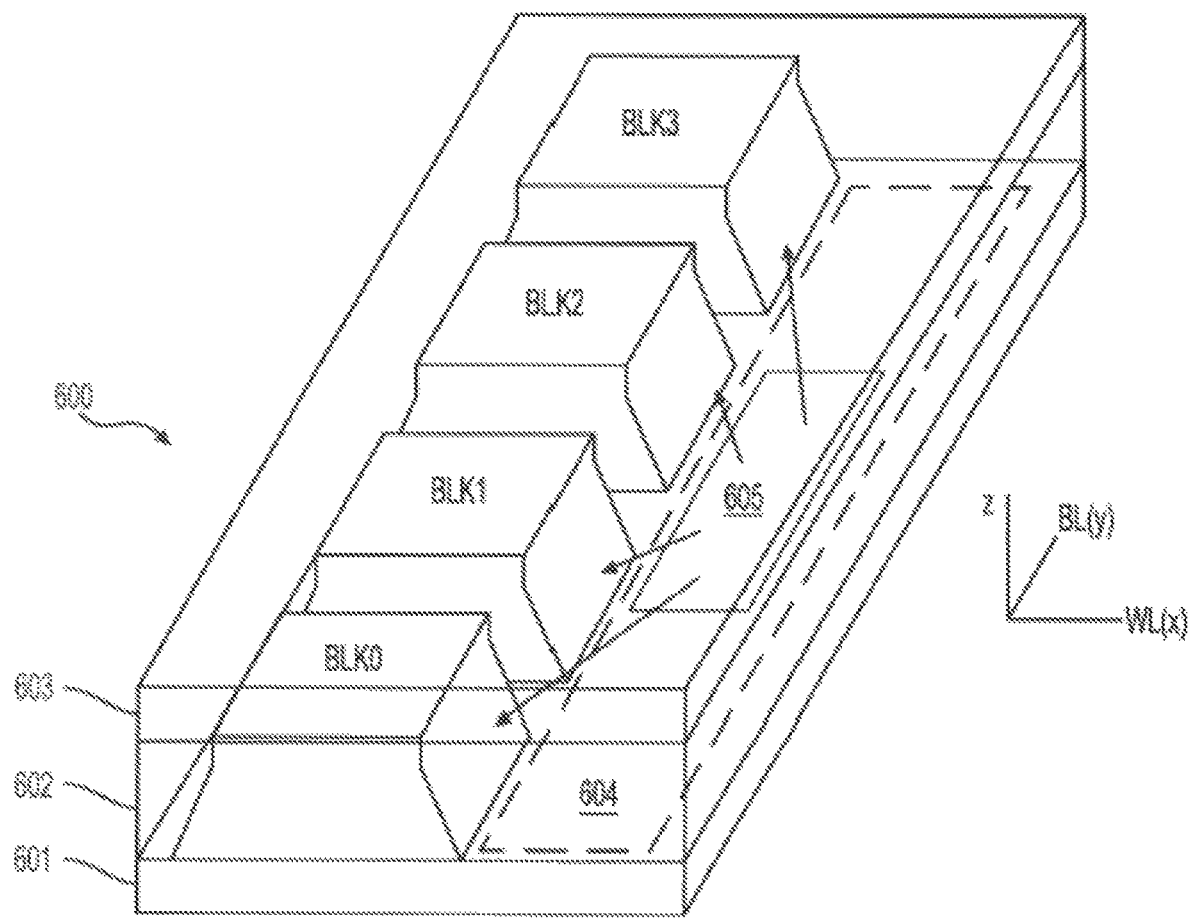
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
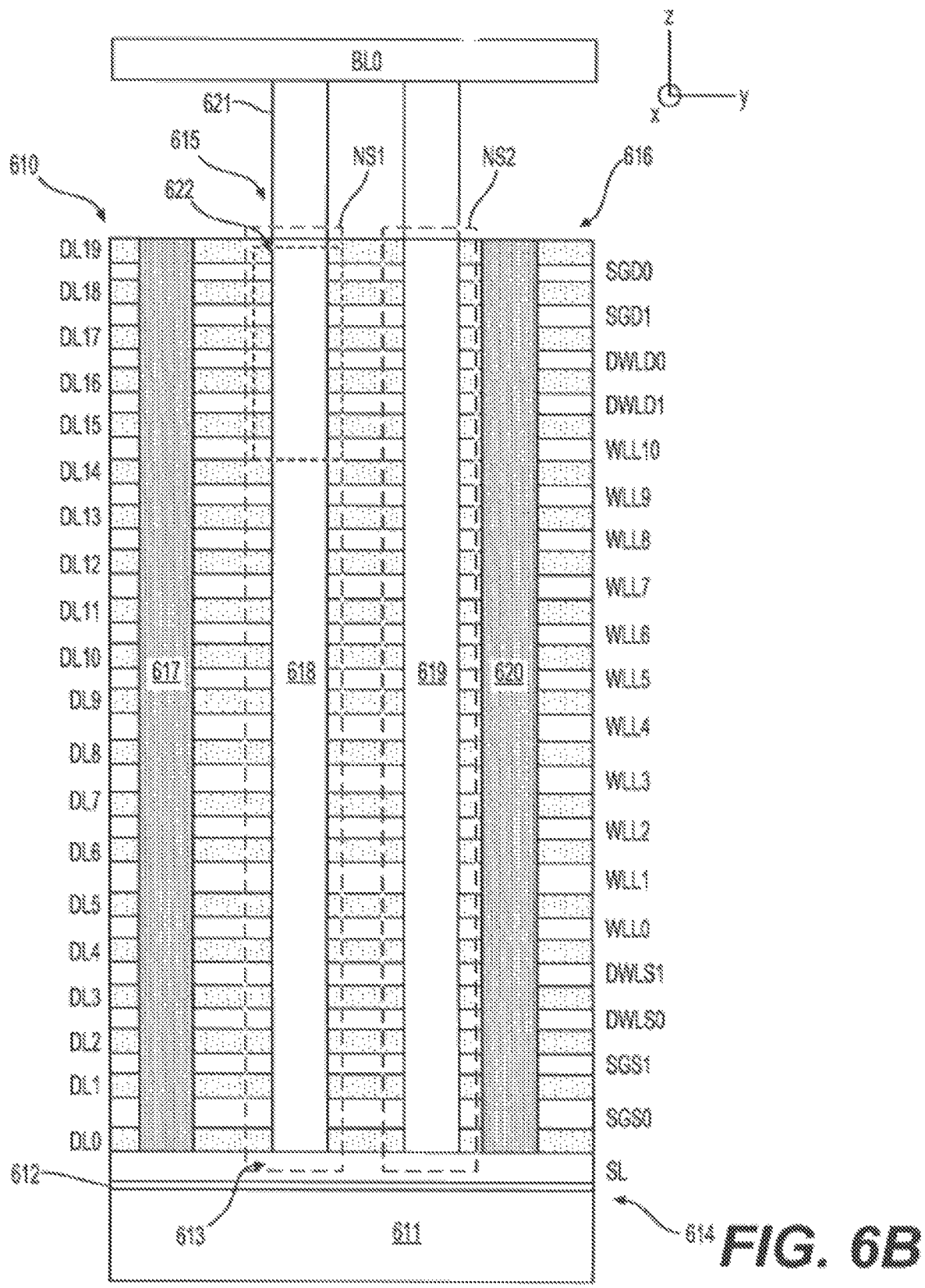
FIG. 6B illustrates an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
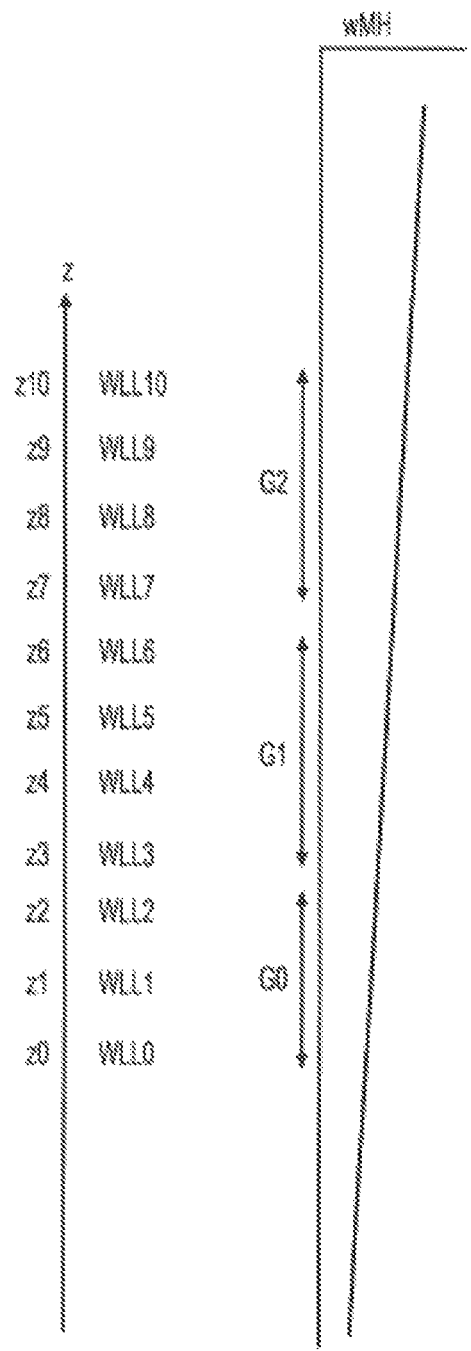
FIG. 6C illustrates a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
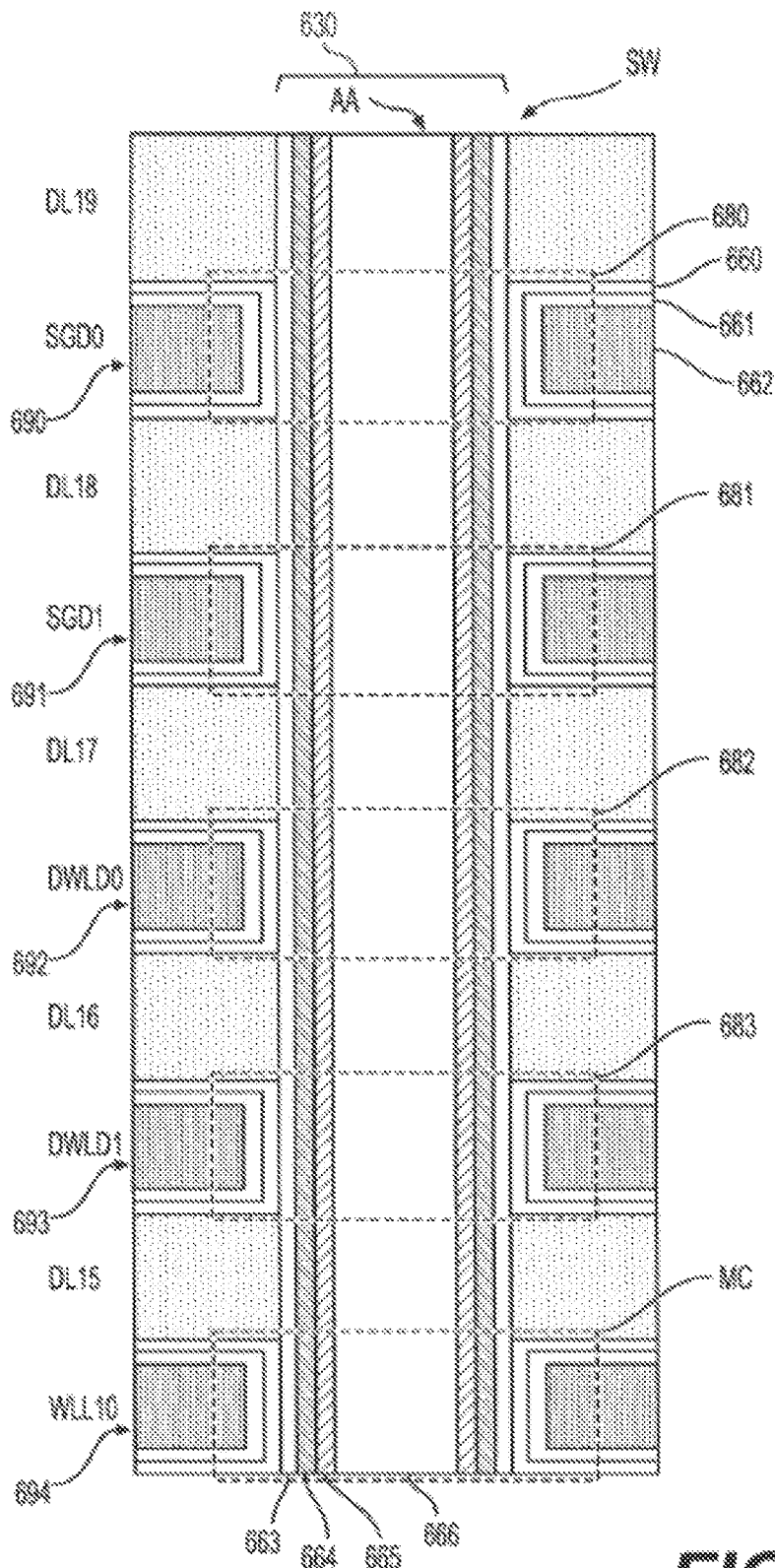
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

There is a continuing need to develop programming techniques which tighten the Vt distributions of the programming data states in order to improve memory reliability but to do so in such a way that the improved reliability does not come at the expense of performance, i.e., programming time. One such programming technique is known as Quick Pass Write (QPW), which slows programming of the memory cells that pass a verify low VL voltage. To slow programming, a QPW voltage is applied to the bit lines coupled to the memory cells that have passed the verify VL associated with a programmed data state (e.g., data state S1) during the following Vpgm pulses. The QPW voltage applied to the bit lines of the memory cells that have passed the VL voltage reduces the voltage difference between the programming pulse Vpgm applied to the control gate of the selected word line and the voltage applied to the bit line coupled to the memory cell to slow programming of the memory cell. Any memory cell which passes a verify high VH voltage is then locked down, or inhibited, from further programming.

Figure 7A:
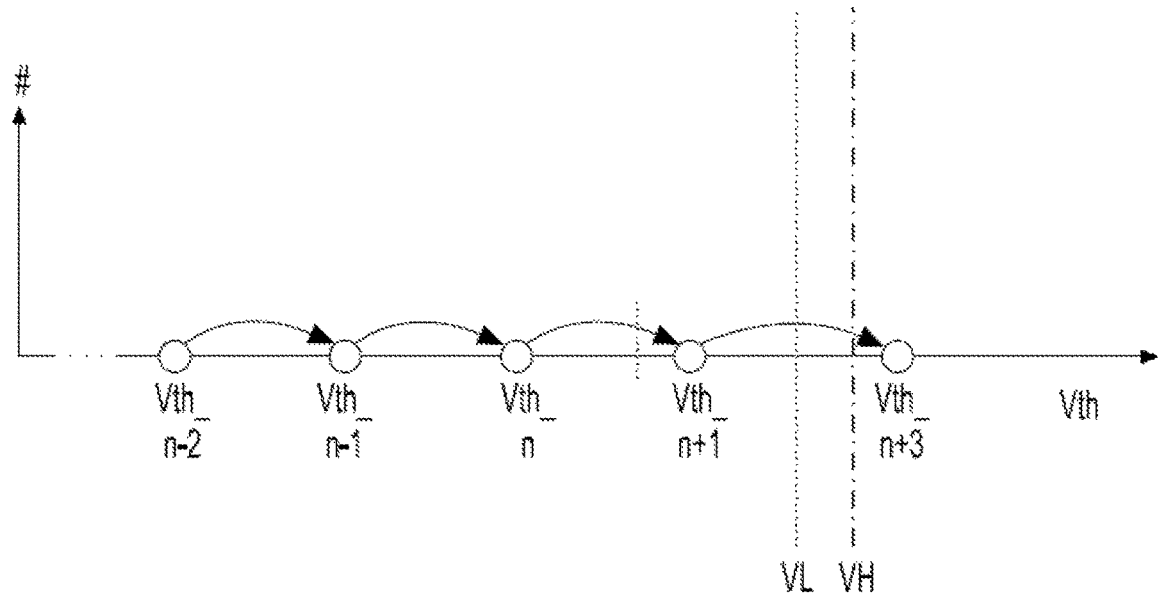
FIG. 7A depicts the threshold voltages of a memory cell during programming where there is too small of a voltage gap between verify low VL and verify high VH.
Figure 7B:
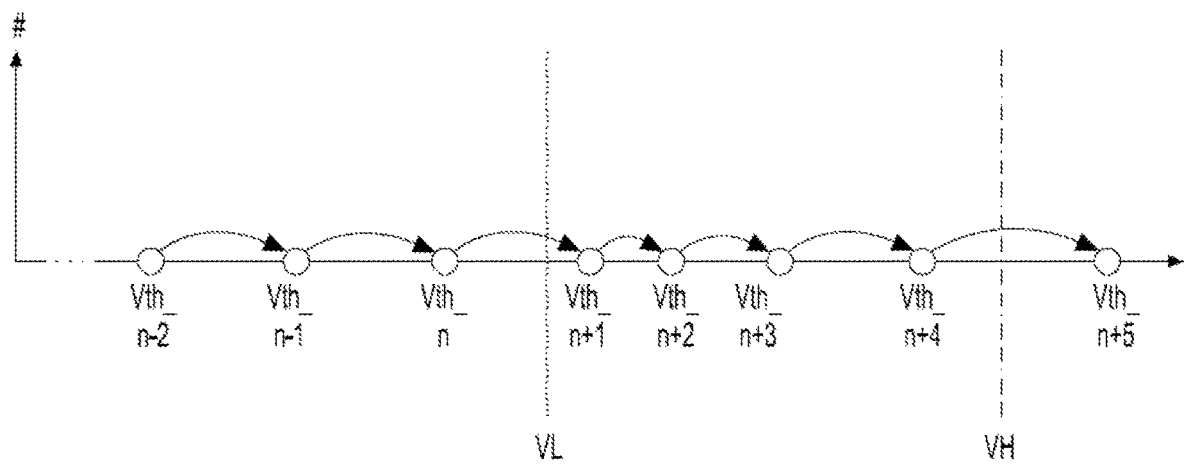
FIG. 7B depicts the threshold voltages of a memory cell during programming where there is too large of a voltage gap between verify low VL and verify high VH.

For QPW programming to be effective, the voltage gap between VL and VH should be maintained at an optimal level. If the voltage gap between VL and VH is too small, some memory cells below while close to the VL level may be directly programmed to over VH level, thus not going through slow-down process in QPW window, leading to over-program issue, as shown in the plot of FIG. 7A with each point identifying the threshold voltage of a particular memory cell following a Vpgm pulse. On the other hand, QPW programming only slows programming for a few (for example, two or three) program-verify iterations. Therefore, if the gap is too large, then some memory cells might get back to non-QPW programming speeds even within the QPW window between VL and VH, as shown in FIG. 7B. This also could lead to overprogramming.

Figure 8A:
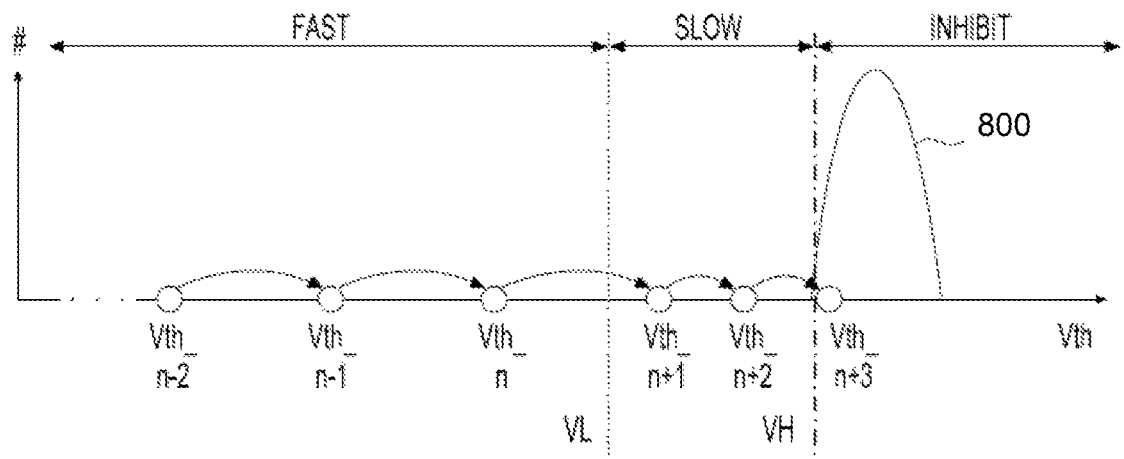
FIG. 8A depicts the threshold voltages of a memory cell during programming according to an aspect of the present disclosure.
Figure 8B:
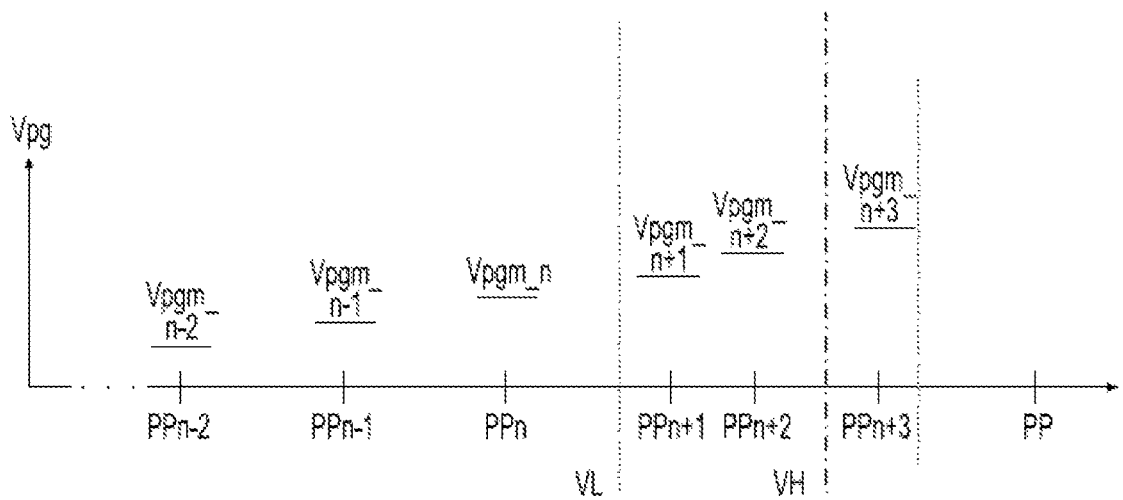
FIG. 8B depicts the Vpgm voltages during the same programming operation of FIG. 8A.
Figure 8C:
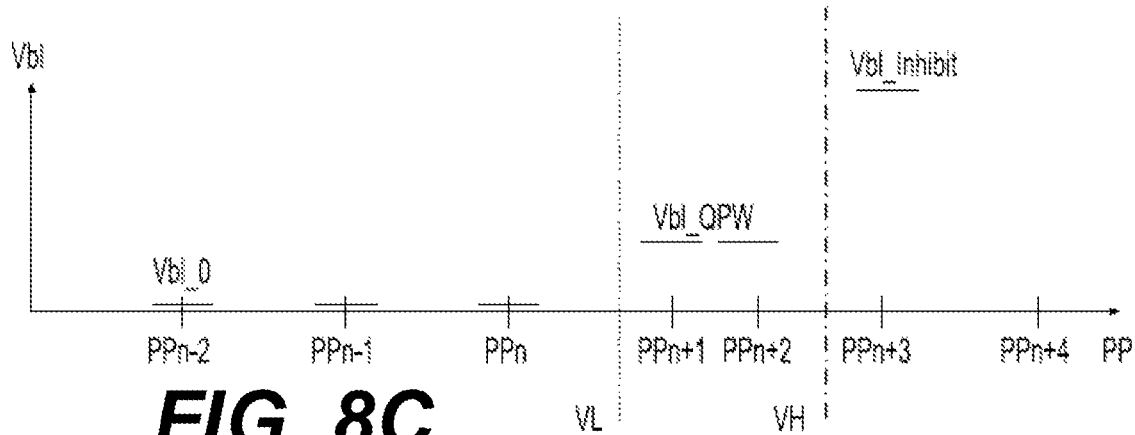
FIG. 8C depicts the bit line voltages applied during the same programming operation of FIGS. 8A and 8B.

FIG. 8A depicts the progress of a Vth of a memory cell in a memory device where there is a proper gap between VL and VH with reference numeral 800 depicting a final Vth distribution of the memory cells programmed to this data state. In FIG. 8B, the horizontal axis depicts a program pulse number, and the vertical axis depicts a corresponding programming voltage Vpgm. In FIG. 8C, the horizontal axis depicts the program pulse number, and the vertical axis depicts a corresponding bit line voltage Vbl. In this example, fast programming occurs in the n−2, n−1, and n program-verify iterations, QPW programming occurs in the n+1 and n+2 program-verify iterations, and programming is inhibited from the n+3 program-verify iteration on. During fast programming, the bit line voltage Vbl is Vbl_0, which is very low, e.g., zero Volts (0 V). During QPW programming, the bit line voltage Vbl is Vbl_QPW, e.g., 0.6 V. During inhibit, the bit line voltage Vbl is Vbl_inhibit, e.g., 2.5 V.

In some programming operations, VL and VH are sensed by applying two separate verify pulses, one for VL and another for VH in each program-verify iteration. However, this can be a time consuming, thereby reducing the performance of the memory device. In other operations, VL and VH are sensed with a single verify pulse applied to the control gate of the selected word line but with different sensing time. In general, the sensing time for VH level is longer, and for VL level is shorter. Within the VL sensing time, if the sense node is fully discharged, then the Vt of the cell is judged as lower than VL, while if the sense node is not discharged sufficiently, the Vt of the cell is judged as higher than VL.

Figure 9:
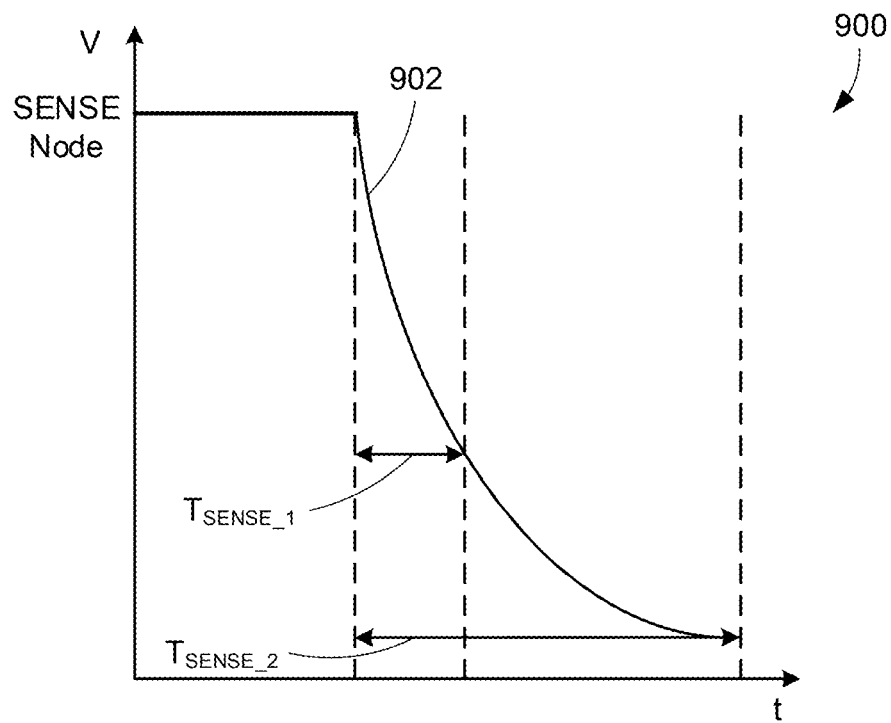
FIG. 9 illustrates a graph showing voltage vs time during a verify operation, in accordance with some described embodiments.

FIG. 9 illustrates a graph 900 showing voltage vs. time during a sensing (verify) operation, in accordance with some described embodiments. The graph 900 shows a curve 902 indicating the voltage as a function of time for a verify operation. In order to perform a program verify, there are two sense times—$T_{SENSE\_1}$ and $T_{SENSE\_2}$—required. These sense times are used to determine whether the Vt of a memory cell is lower or higher than VL or VH. This will be shown and described below.

Figure 10:
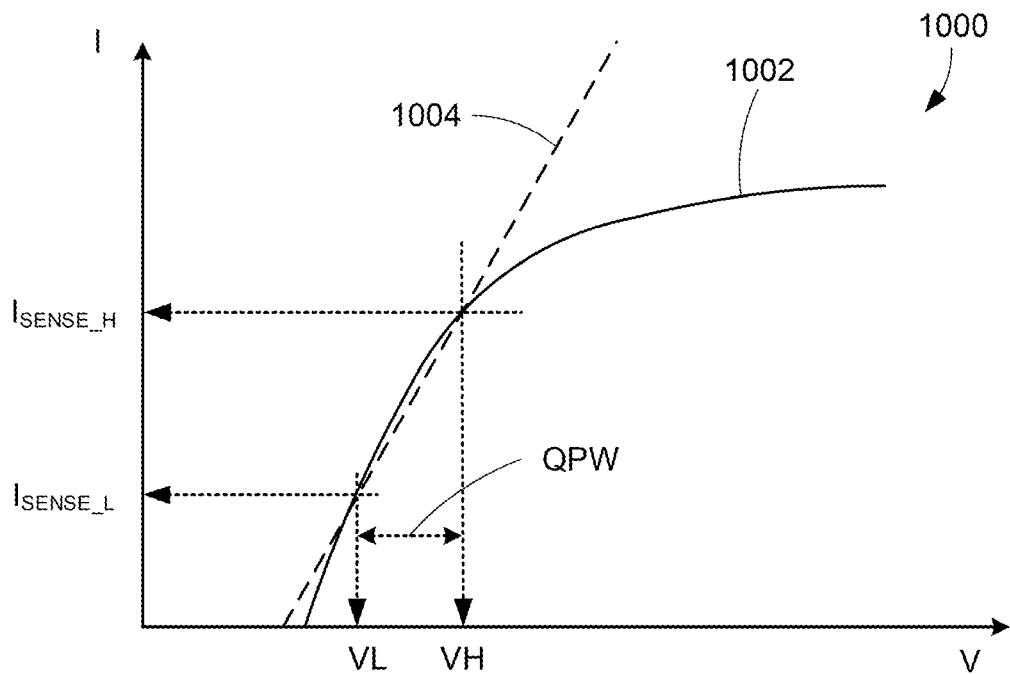
FIG. 10 illustrates a graph showing current vs voltage during a verify operation, in accordance with some described embodiments.

FIG. 10 illustrates a graph 1000 showing current vs voltage during a verify operation, in accordance with some described embodiments. The graph 1000 shows a curve 1002 indicating the sensed current as a function of voltage for a verify operation. The values for the sensed currents $I_{SENSE\_H}$ and $I_{SENSE\_L}$ are determined by $T_{SENSE\_1}$ and $T_{SENSE\_2}$, respectively, shown in FIG. 9. Using the curve 1002, the sensed currents $I_{SENSE\_H}$ and $I_{SENSE\_L}$ correspond to VH and VL, respectively. VH is set to be the Vt of the memory cell after programming, and the voltage gap between VH and VL is the QPW window.

QPW is used to slow programming of the memory cells in the QPW window and thereby tighten the final Vt distribution after programming is completed. Ideally, the distribution is relatively narrow. In this manner, the sense times (e.g., in FIG. 9) can be optimized to ultimately optimize the QPW window and subsequently control/maintain the Vt distribution. By controlling sense times, issues (e.g., over-programming) may be avoided.

Additionally, a line 1004 (i.e., linear path) drawn from $I_{SENSE\_L}$ to $I_{SENSE\_H}$ represents a SS for the memory cell. The slope of the line 1004 is based on the intersection between the curve 1004 and the points on the curve represented by $I_{SENSE\_L}$ and $I_{SENSE\_H}$. A steep SS exhibits a faster transition between off (low current) and on (high current) states, which may be desirable. However, when the cycling number (i.e., number of program-erase cycles) increases, the SS begins to flatten and widen the QPW window, leading to a widened Vt distribution. As a result, over-programming and other issues may occur and contribute to a widened Vt distribution.

Figure 11:
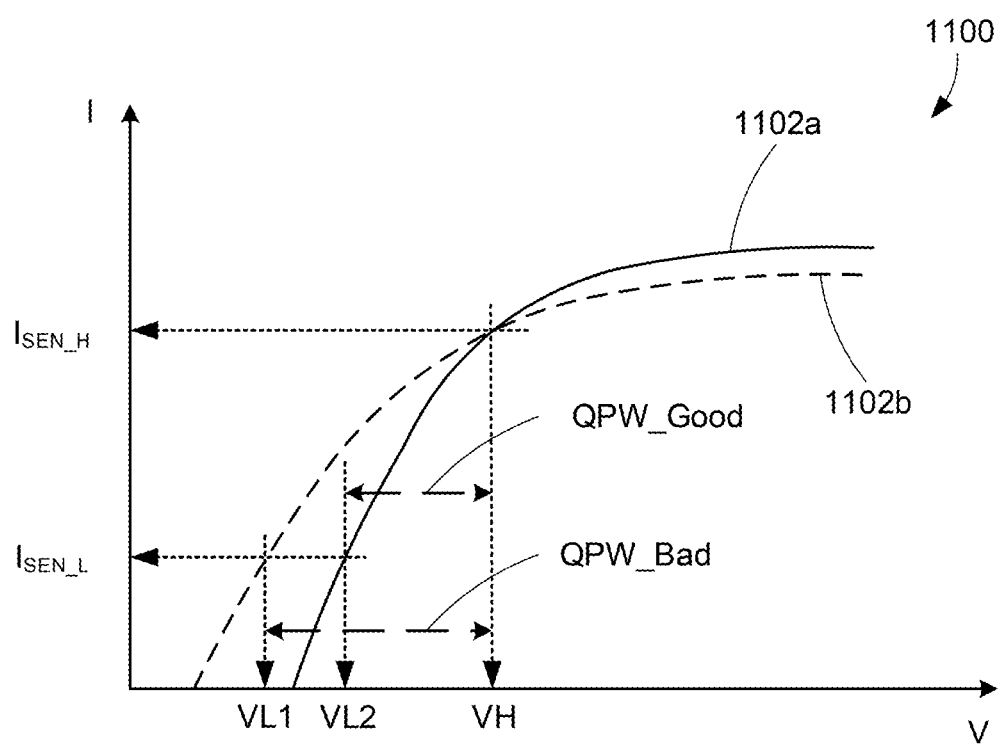
FIG. 11 illustrates a graph showing current vs voltage during a verify operation, further showing a resultant shift in VL, in accordance with some described embodiments.

FIG. 11 illustrates a graph 1100 showing current vs. voltage during a verify operation, further showing a resultant shift in VL (from VL2 to VL1), in accordance with some described embodiments. A curve 1102a represents the current as a function of voltage for BOL, while a curve 1102b represents the current as a function of voltage for EOL.

Using the curve 1102a, the QPW window ("QPW-_Good") created between $I_{SEN\_L}$ (corresponding to VL2) and $I_{SEN\_H}$ (corresponding to VH) provides a QPW window that limits or prevents over-programming and maintains a desired Vt distribution. However, using the curve 1102b, the modified QPW window ("QPW Bad") created between $I_{SENSE\_L}$ (corresponding to VL1) and $I_{SENSE\_H}$ (corresponding to VH) provides a widened QPW window that may allow over-programming and a widened Vt distribution. Accordingly, the VL value begins to shift and decrease due to cycling (and other factors). In some instances, a table is used to alter read and verify levels based upon the "age" (i.e., cycling number or cycling times) of a memory cell. However, additional parameters can be altered to optimize memory cell usage.

Figures 12, 13:
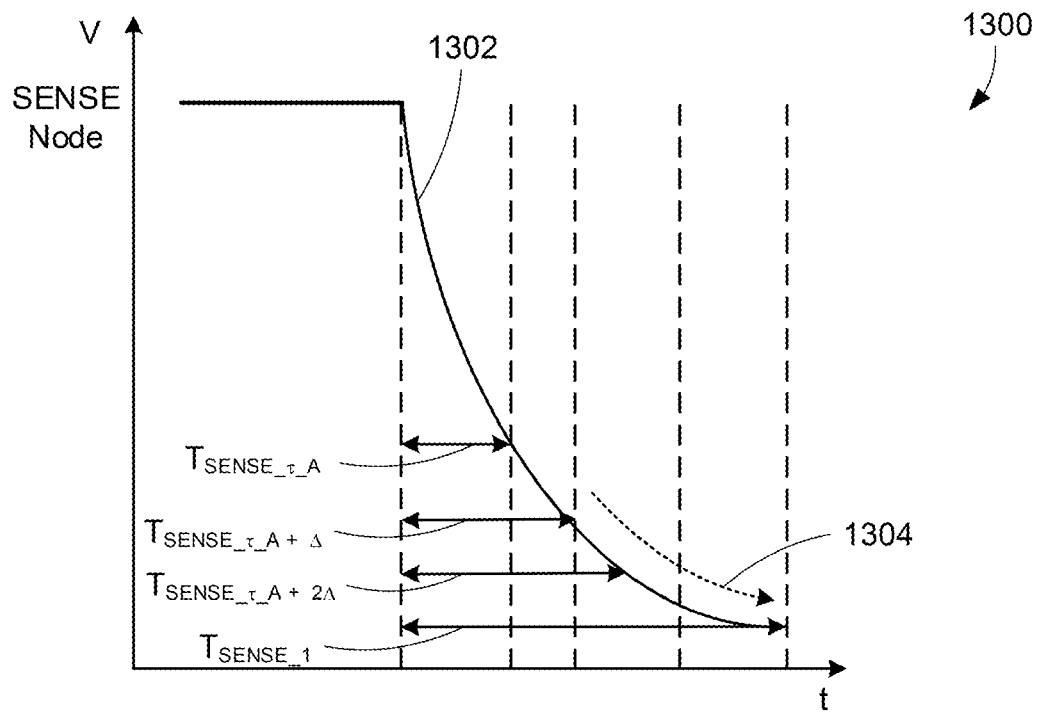
FIG. 12 illustrates a table showing sense times based on a cycling number, in accordance with some described embodiments.
FIG. 13 illustrates a graph showing voltage vs time during a verify operation, in accordance with some described embodiments.

FIG. 12 illustrates a table 1200 showing sense times based on a cycling number, in accordance with some described embodiments. The table 1200 may be referred to as an adaptive sensitive time table used to dynamically adjust the sense time to determine the VL voltage for blocks with variant cycling times. As shown, the table 1200 includes a column 1202a of cycling numbers (i.e., program-erase cycles) for memory blocks A, B, C, and D, with the cycling number increasing from top to bottom, including 1 cycling number (generally denoting a "fresh" block), 4K (or 4,000 cycles), and 8K (or 8,000 cycles).

Further, the table 1200 shows the sense time decreasing for an increased cycling number. For example, referring to a column 1202b for memory cells in memory block A, when the block is fresh with a cycling number of 1 (or approximately 1), the sense time for memory cells in cell block A is τ_A. When the cycling number increases to 4K, the sense time increases from τ_A to τ_A+Δ (i.e., an addition of 4), where A is a predetermined number. When the cycling number increases from 4K to 8K, the sense time further increases from $\tau\_A+\Delta$ to $\tau\_A+2\Delta$ (i.e., an additional addition of $\Delta$). Accordingly, the increased sense time is based on a multiple of $\Delta$. Similarly, columns 1202c, 1202d, and 1202e include adjusted sense times for memory cells of memory blocks B, C, and D, respectively, with different respective initial sense times and corresponding increased sense time of $\Delta$. It should be noted that "4K" and "8K" are exemplary cycling numbers, and other cycling numbers are possible.

FIG. 13 illustrates a graph 1300 showing voltage vs time during a verify operation, in accordance with some described embodiments. The graph 1300 includes a curve 1302 illustrating the voltage change with sense time. The sense time $T_{SENSE\_1}$ represents a sense time to determine VH (see for example, FIG. 10). As the cycling number increases, as indicated by the arrow 1304, the curve 1302 shows the sense time for VL level increasing. For example, the sense time $T_{SENSE\_\tau\_A}$ is smaller than $T_{SENSE\_\tau\_A+\Delta}$, which is in turn smaller than $T_{SENSE\_\tau\_A+2\Delta}$. By increasing the sense time in this manner, the Vt distribution undergoes minimal change as the cycling number increases. In other words, the Vt distribution can be maintained (or at least substantially maintained) in a manner similar to the Vt distribution at BOL.

The foregoing embodiments and examples show and describe methods to incorporate an adaptive sense time to maintain (or at least substantially maintain) the Vt distribution for memory cells in a memory block. However, due to fabrication imperfections, the MANOS structures have intrinsic variations from die to die. Moreover, other changes (e.g., atrophy of memory cells over the course of program-erase cycles) may cause additional changes to the die. As a result, the respective memory cells of the different die can change differently in their own respective manner over time. However, the embodiments described below set forth a manner for generating different DSEN tables for different dies. For example, a DSEN table may be initially used for all die at BOL, with subsequent respective DSEN tables for each die.

Figure 14:
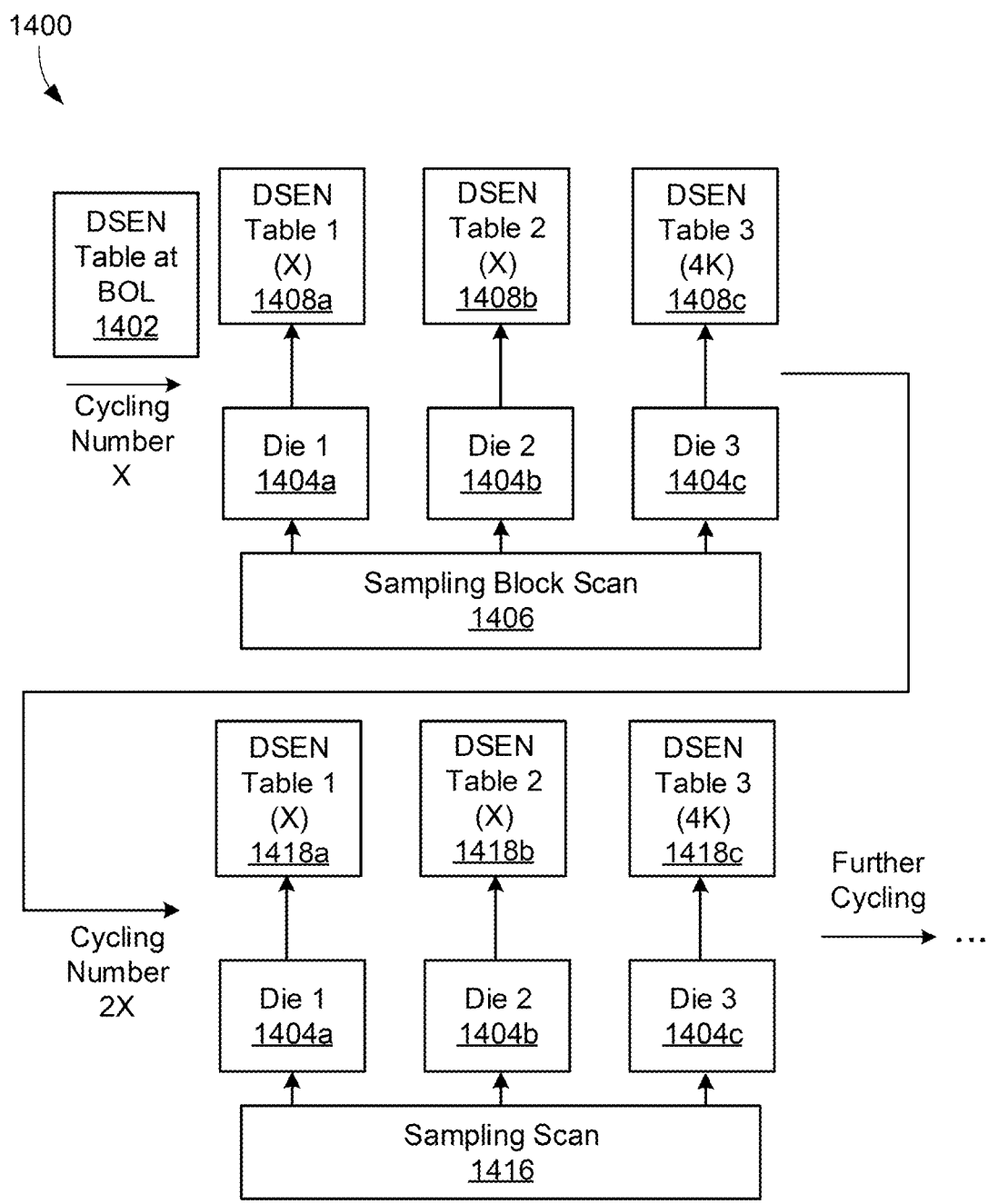
FIG. 14 illustrates a block diagram used to manage die-to-die variations, in accordance with some described embodiments.

FIG. 14 illustrates a block diagram 1400 used to manage die-to-die variations, in accordance with some described embodiments. The block diagram 1400 may refer to various features of a memory system, which includes Die 1 1404a, Die 2 1404b, and Die 3 1404c (representative of several additional dies). Prior to usage, the aforementioned dies are at BOL. Accordingly, these dies can use a DSEN table at BOL 1402. However, after cycling number of the memory cells of the dies reach X program-erase cycles (e.g., 4K cycles), each of the dies 1404a, 1404b, and 1404c may have different optimal sense times, due in part to their respective fabrication.

In order to determine respective sense time, a sampling block scan 1406 is used to perform a background scan to the dies 1404a, 1404b, and 1404c. The sampling block scan 1406 may occur while the SDD is idle. Further, the sampling block scan 1406 is performed when the cycling number of the memory cells is X. Using the sampling block scan 1406, the system can obtain DSEN Table 1 1408a, DSEN Table 2 1408b, and DSEN Table 3 1408c, which are used as DSEN tables for Die 1 1404a, Die 2 1404b, and Die 3 1404c, respectively. Accordingly, each die can use its own optimal sense time based on the sampling block scan 1406.

After additional program-erase cycles, the process can be repeated to further optimize sense times. For example, when the cycling number of the memory cells of the dies reach 2× program-erase cycles (e.g., 8K cycles), each of the dies 1404a, 1404b, and 1404c may again have different optimal sense times. In order to determine respective sense time, a sampling block scan 1416 is used to perform a background scan to the dies 1404a, 1404b, and 1404c. Similar to the sampling block scan 1406, the sampling block scan 1416 may occur while the SDD is idle. Further, the sampling block scan 1416 is performed when the cycling number is 2×. Using the sampling block scan 1416, the system can obtain DSEN Table 1 1418a, DSEN Table 2 1418b, and DSEN Table 3 1418c, which are used as DSEN tables for Die 1 1404a, Die 2 1404b, and Die 3 1404c, respectively. Moreover, these DSEN tables represent updated DSEN tables based upon the memory cells having undergone 2× program-erase cycles. Accordingly, each die can again use its own updated optimal sense time based on the sampling block scan 1416. The block diagram 1400 shows and describes a process for providing and updating adaptive sense times for respective memory cells on different dies. It should be noted that "4K" and "8K" are exemplary cycling numbers, and other cycling numbers are possible.

Figure 15:
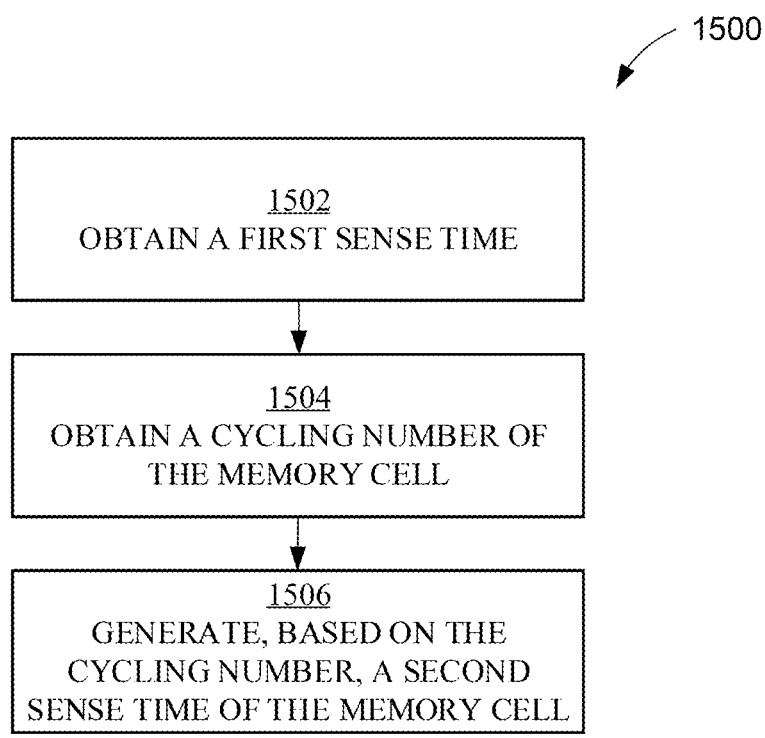
FIG. 15 illustrates a flowchart showing a method for managing a threshold voltage distribution for a memory cell, in accordance with some described embodiments.

FIG. 15 illustrates a flowchart 1500 showing a method for managing a threshold voltage distribution for a memory cell, in accordance with some described embodiments. The process/method shown and described in the flowchart 1500 can be used to provide an adaptive sense time based upon, for example, the number of program-erase cycles for a memory cell. The adaptive sense time can be used to adjust VL, which in turn maintains (or at least substantially maintains) a desired QPW window and Vt distribution.

In step 1502, a first sense time is obtained. As an example, the step of obtaining may include receiving, by a memory system, the first sense time. The first sense time (e.g., $T_{SENSE\_1}$) can be used to determine $I_{SENSE\_H}$ and an associated VH.

In step 1504, a cycling number of the memory cell is obtained. As an example, the step of obtaining may include receiving, by a memory system, a program-erase cycle number indicative of the number of program-erase cycles of a memory cell. The cycling number may include the number of program-erase cycles of the memory cell.

In step 1506, a second sense time of the memory cell are generated based on the cycling number. As an example, the step of obtaining may include receiving, by a memory system, the second sense time. The second sense time (e.g., $T_{SENSE\_2}$) can be used to determine $I_{SENSE\_L}$ and an associated VL. Using VL and VH, a QPW window is established. Further, as the cycling number increases, the second sense time can be updated/replaced by, for example, a new sense time that may be longer (i.e., in terms of time) than the second sense time. In this manner, the VL can be maintained (or at least substantially maintained), and thus the QPW window and the Vt distribution can be maintained (or at least substantially maintained) as the cycling number increases.

Figure 16:
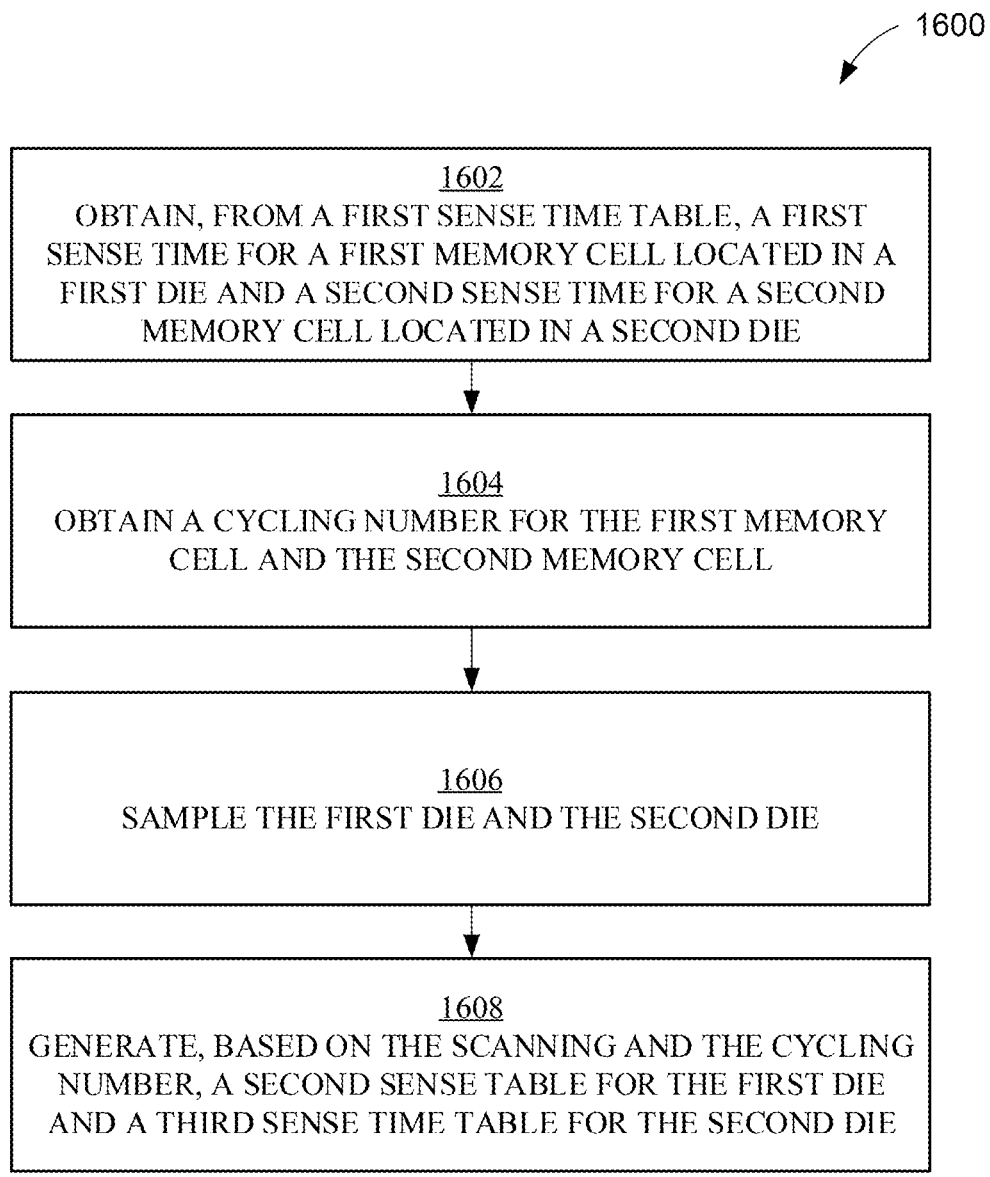
FIG. 16 illustrates a flowchart showing a method for managing die-to-die variations, in accordance with some described embodiments.

FIG. 16 illustrates a flowchart 1600 showing a method for managing die-to-die variations, in accordance with some described embodiments. The method shown and described in the flowchart 1600 can be used to generate dynamic sense tables for individual dies, and accordingly, each dynamic sense table can be adapted and utilized for a specific die.

In step 1602, a first sense time for a first memory cell located in a first die and a second sense time for a second memory cell located in a second die are obtained from a first sense time table. In some embodiments, the first sense time table refers to an initial DSEN table when the first die and the second die (representative of additional dies) are at BOL.

In step 1604, a cycling number for the first memory cell and the second memory cell is obtained. As an example, the step of obtaining may include receiving, by a memory system, a program-erase cycle number indicative of the number of program-erase cycles of a memory cell. The cycling number may include the number of program-erase cycles of the memory cell.

In step 1606, the first die and the second die are sampled. The sampling may include sampling block scan. Further, the sampling block scan may be performed after the cycling number is obtained. Moreover, the sampling block scan may be performed after the cycling number occurs. For, example, when the cycling number reaches X program-erase cycles (where X is 4K cycles, as an example), the first die and the second die are sampled.

In step 1608, both a second sense table for the first die and a third sense time table for the second die are generated based on the scanning and the cycling number. As a result of the second and third sense time tables, the first and second dies, respectively, have their own unique adaptive sense time tables. Further, the second and third sense time tables can be used as adaptive sense time tables for other memory cells on the first and second dies, respectively. Additional scans (see step 1606) may occur at multiple of X (e.g., 2×), and subsequently, new adaptive sense times tables can be generated and used for the first and second dies.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for managing a threshold voltage distribution for a memory cell, the method comprising the steps of:
   obtaining a first sense time that corresponds to a first verify voltage of a programming state;
   obtaining a cycling count of the memory cell;
   generating, based on the cycling count, a second sense time that corresponds to a second verify voltage of the programming state; and
   wherein a voltage gap between the first and second verify voltages defines a QPW window.

2. The method according to claim 1, wherein the first verify voltage is greater than the second verify voltage.

3. The method according to claim 2, wherein the first sense time is longer than the second sense time.

4. The method according to claim 1, wherein when the cycling count increases from a first cycling count to a second cycling count, the second sense time increases from a first time to a second time.

5. The method according to claim 1, wherein generating the second sense time comprises:
   obtaining a predetermined number; and
   adding the predetermined number from a prior sense time.

6. The method according to claim 1, further comprising generating, based on a second cycling count greater than the cycling count, a third sense time of the memory cell, wherein the third sense time is longer than the second sense time.

7. A memory system, comprising:
   a memory device; and
   a controller operatively coupled to the memory device, the controller configured to:
   obtain a first sense time that corresponds to a first verify voltage of a programming state;
   obtain a cycling count of the memory cell;
   generate, based on the cycling count, a second sense time of the memory cell, the second sense time corresponding to a second verify voltage of the programming state; and
   wherein a voltage gap between the first and second verify voltages defines a QPW window.

8. The memory system according to claim 7, wherein the first verify voltage is greater than the second verify voltage.

9. The memory system according to claim 8, wherein the first sense time is longer than the second sense time.

10. The memory system according to claim 7, wherein when the cycling count increases from a first cycling count to a second cycling count, the second sense time increases from a first time to a second time.

11. The memory system according to claim 7, wherein when the controller generates the second sense time, the controller is configured to:
    obtain a predetermined number; and
    add the predetermined number from a prior sense time.

12. The memory system according to claim 7, wherein the controller is configured to generate, based on a second cycling number greater than the cycling number, a third sense time of the memory cell, wherein the third sense time is longer than the second sense time.

13. A non-transitory computer readable storage medium configured to store instructions that, when executed by a programming and sensing means, causes the memory system to carry out steps to:
    obtain a first sense time that corresponds with a first verify voltage of a programming state;
    obtain a cycling count of the memory cell;
    generate, based on the cycling count, a second sense time of the memory cell, the second sense time corresponding with a second verify voltage of the programming state; and
    wherein a voltage gap between the first and second verify voltages defines a QPW window.

14. The non-transitory computer readable storage medium according to claim 13, wherein:
    the first verify voltage is greater than the second verify voltage, and
    the first sense time is longer than the second sense time.

15. The non-transitory computer readable storage medium according to claim 14, wherein when the cycling count increases from a first cycling count to a second cycling count, the second sense time increases from a first time to a second time.

16. The non-transitory computer readable storage medium according to claim 13, wherein when the programming and sensing means generates the second sense time, the programming and sensing means is configured to:
    obtain a predetermined number; and
    add the predetermined number from a prior sense time.

17. The non-transitory computer readable storage medium according to claim 13, wherein the programming and sensing means is configured to generate, based on a second cycling number greater than the cycling number, a third sense time of the memory cell, wherein the third sense time is longer than the second sense time.

* * * * *